(12) United States Patent
Tochiyama et al.

(10) Patent No.: US 11,502,022 B2
(45) Date of Patent: Nov. 15, 2022

(54) HEATSINK, AND SEMICONDUCTOR MODULE INCLUDING THE HEATSINK

(71) Applicant: Mitsubishi Electric Corporation, Tokyo (JP)

(72) Inventors: Shigenobu Tochiyama, Tokyo (JP); Yuhei Nagashima, Tokyo (JP); Masayoshi Tamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 478 days.

(21) Appl. No.: 16/752,863

(22) Filed: Jan. 27, 2020

(65) Prior Publication Data
US 2020/0286812 A1 Sep. 10, 2020

(30) Foreign Application Priority Data
Mar. 5, 2019 (JP) .............................. JP2019-039202

(51) Int. Cl.
*H01L 23/473* (2006.01)
*H05K 7/20* (2006.01)
*F28F 13/08* (2006.01)

(52) U.S. Cl.
CPC ............ *H01L 23/473* (2013.01); *F28F 13/08* (2013.01); *H05K 7/209* (2013.01); *H05K 7/20927* (2013.01); *F28F 2215/08* (2013.01)

(58) Field of Classification Search
CPC ... H01L 23/473; H01L 23/3677; H01L 23/46; H05K 7/20927; H05K 2201/09054;
(Continued)

(56) References Cited

U.S. PATENT DOCUMENTS 7,522,422 B2 * 4/2009 Chiba ................... H01L 23/473
361/709
8,651,704 B1 * 2/2014 Gordin .................... F21V 29/60
362/373
(Continued)

FOREIGN PATENT DOCUMENTS

JP 2008-172014 A 7/2008
JP 5975110 B2 8/2016
(Continued)

OTHER PUBLICATIONS

Communication dated Jul. 7, 2020, from the Japanese Patent Office in Application No. 2019-039202.

*Primary Examiner* — Adam B Dravininkas
(74) *Attorney, Agent, or Firm* — Sughrue Mion, PLLC; Richard C. Turner

(57) ABSTRACT

A refrigerant channel of a heatsink includes an upwardly inclined channel formed by a side wall for downstream side of a first protruding portion and a side wall for upstream side of a second protruding portion. The upwardly inclined channel directs a flow of the refrigerant toward a base portion of the fin and causes the refrigerant to flow into the fin region, because of which more refrigerant flows to the base portion than to a leading end portion of the fin, and a high heat dissipating performance is obtained. Also, the fin is a columnar body whose sectional form perpendicular to a central axis is a regular hexagon, has rounded portions in corner portions, and has tapers on side faces. Six fins are disposed neighboring one fin, and a distance between fins is constant. Because of this, the heat dissipating performance further improves, and pressure loss can be reduced.

19 Claims, 8 Drawing Sheets

(58) Field of Classification Search
CPC ........ H05K 7/20; H05K 7/20254; F28D 1/03;
F28D 2021/0029; F28F 13/08; F28F
13/06; F28F 2215/08; F28F 3/022; F28F
3/12; F28F 13/12; F28F 3/02; F28F 27/02
See application file for complete search history.

(56) References Cited

U.S. PATENT DOCUMENTS

| | | | | |
|---|---|---|---|---|
| 2005/0092007 | A1* | 5/2005 | Gutfeld | F28F 3/04 257/E23.098 |
| 2007/0029070 | A1* | 2/2007 | Yamamoto | F04B 43/043 417/322 |
| 2007/0056719 | A1* | 3/2007 | Katoh | F28F 17/005 165/146 |
| 2008/0230208 | A1* | 9/2008 | Rasmussen | F28F 13/00 165/80.4 |
| 2009/0114372 | A1* | 5/2009 | Ippoushi | F28F 3/12 165/104.19 |
| 2010/0090336 | A1* | 4/2010 | Yoshida | H01L 23/473 257/E23.08 |
| 2013/0220587 | A1* | 8/2013 | Tamura | F28F 3/022 165/185 |
| 2014/0054762 | A1 | 2/2014 | Nagaune | |
| 2014/0158324 | A1* | 6/2014 | Tochiyama | H01L 23/473 165/67 |
| 2015/0021756 | A1* | 1/2015 | Adachi | H01L 23/473 257/714 |
| 2017/0025326 | A1* | 1/2017 | Koyama | H01L 23/473 |
| 2019/0137195 | A1 | 5/2019 | Arata et al. | |

FOREIGN PATENT DOCUMENTS

| | | |
|---|---|---|
| WO | 2012/157247 A1 | 11/2012 |
| WO | 2017/195270 A1 | 11/2017 |

* cited by examiner

HEATSINK, AND SEMICONDUCTOR MODULE INCLUDING THE HEATSINK

BACKGROUND OF THE INVENTION

Field of the Invention

The present application relates to a heatsink, and to a semiconductor module including the heatsink.

Description of the Background Art

In recent years, size reduction and increased output of heat generating elements such as a central processing unit (CPU), a large-scale integrated circuit (LSI), and a power semiconductor element have been advancing, and an amount of heat generated is increasing because of an increase in heat generation density. Because of this, heatsinks including liquid-cooled type (water-cooled type) fins, which have a higher heat dissipating performance than an air-cooled type, are being widely used.

A heatsink wherein a refrigerant is caused to collide with a multiple of pin fins disposed in a refrigerant channel, and heat from the fins is caused to be dissipated into the refrigerant, is known as a heatsink for cooling a semiconductor module in which a power semiconductor element is mounted (Patent Document 1). This kind of heatsink is such that a difference in a cooling effect occurs between a semiconductor element disposed in a place in which an amount of refrigerant flowing is large and a semiconductor element disposed in a place in which an amount of refrigerant flowing is small. Because of this, various contrivances that restrict variation in the amount of flow in a width direction of the refrigerant channel are employed. Specifically, a wall, a groove, a protrusion, or the like, for promoting dispersion of the refrigerant is provided in the channel.

In Patent Document 1, a cooler including a multiple of fins provided on a heat dissipating substrate and a box-like cooling case that houses the fins is such that by providing a diffusing wall that causes a refrigerant introduced through an inlet provided in a first side wall of the cooling case to be diffused along the first side wall, the flow of the refrigerant flowing to the aggregate of fins is uniformized. Also, square pins of a prismatic form, round pins of a cylindrical form, fins of a blade form, or the like, are used as the fins.

Patent Document 1: Japanese Patent No. 5,975,110

As heretofore described, an existing heatsink that includes liquid-cooled type fins is such that a contrivance whereby the amount of refrigerant flowing becomes uniform in the width direction of the channel is employed, and in many cases, the refrigerant is caused to flow in a direction perpendicular to a central axis of each pin fin. That is, the existing heatsink is such that the channel is formed so that the refrigerant flows uniformly from a base portion of the pin fin to a leading end portion.

However, a liquid-cooled type fin is such that a large amount of heat exchange is carried out in a vicinity of the base portion of the fin, and the leading end portion of the fin contributes hardly anything to heat dissipation. This means that when the refrigerant is caused to flow in a direction perpendicular to the central axis of the pin fin, there is refrigerant that is hardly utilized at all for heat dissipation.

Also, liquid-cooled type fins are such that the greater a flow velocity of the refrigerant flowing between fins, the greater the heat dissipating performance, and a region in which a distance between fins is smallest is a region of maximum flow velocity. However, when the fins are of a cylindrical form, only a space between side faces that intersect with a straight line joining the central axes of neighboring fins is the region of maximum flow velocity. Because of this, there is a problem in that the heat dissipating performance of only one small portion of the fin is high, and the heat dissipating performance overall is low.

SUMMARY OF THE INVENTION

The present application discloses technology for resolving the heretofore described kinds of problem, and has an object of obtaining a heatsink such that a heat dissipating performance of a liquid-cooled type fin can be improved, and a semiconductor module including the heatsink.

A heatsink disclosed in the present application is a heatsink including a base having a mounting face on which a semiconductor element is mounted, and having a fin region in which a multiple of fins are provided in one portion of a face on a side opposite to that of the mounting face, a case that is disposed opposing the base, houses the fins, and forms a refrigerant channel together with the base, an inlet that causes a refrigerant to flow into the refrigerant channel, and a discharge port that causes the refrigerant to flow out from the refrigerant channel, wherein the base has a first protruding portion that protrudes into the refrigerant channel on an upstream side of the fin region and the case has a second protruding portion that protrudes into the refrigerant channel in a place opposing the fin region, the refrigerant channel includes an upwardly inclined channel formed by a side wall for downstream side of the first protruding portion and a side wall for upstream side of the second protruding portion, and the upwardly inclined channel directs a flow of the refrigerant toward a base portion of the fin and causes the refrigerant to flow into the fin region.

Also, a semiconductor module disclosed in the present application provided with the heatsink of the present application, and the semiconductor element is mounted on the mounting face.

According to a heatsink disclosed in the present application, an upwardly inclined channel that directs a flow of refrigerant to a base of a fin is provided, and more refrigerant is caused to flow to the base portion than to a leading end portion of the fin, because of which a heat dissipating performance of the fin improves, and a heatsink that has a high heat dissipating performance is obtained. Therefore, a heat dissipating performance of a semiconductor module including the heatsink disclosed in the present application improves.

The foregoing and other objects, features, aspects, and advantages of the present application will become more apparent from the following detailed description of the present application when taken in conjunction with the accompanying drawings.

DETAILED DESCRIPTION OF THE PREFERRED EMBODIMENTS

First Embodiment

Figure 1:
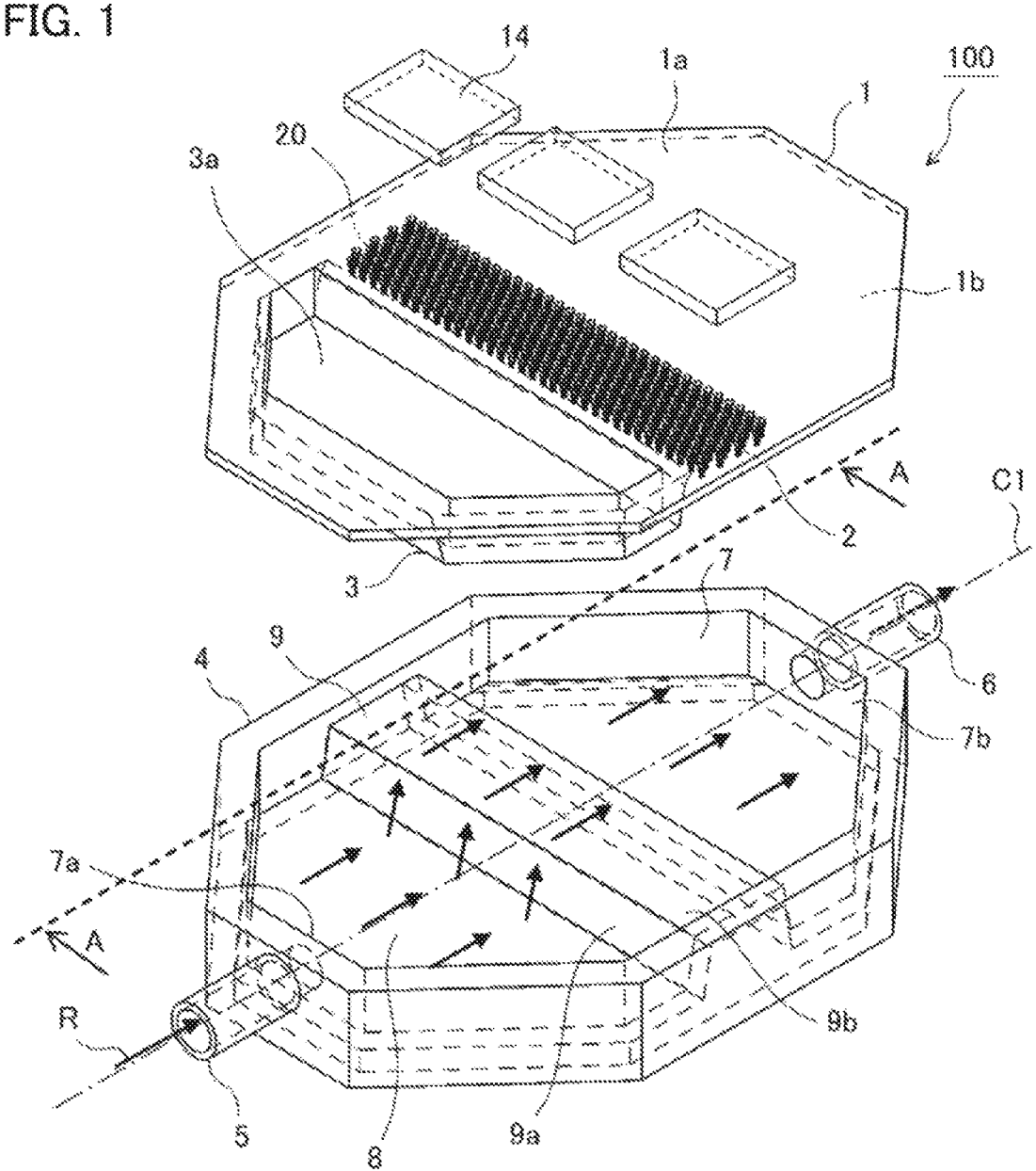
FIG. 1 is an exploded perspective view showing a semiconductor module including a heatsink according to a first embodiment.
Figure 2:
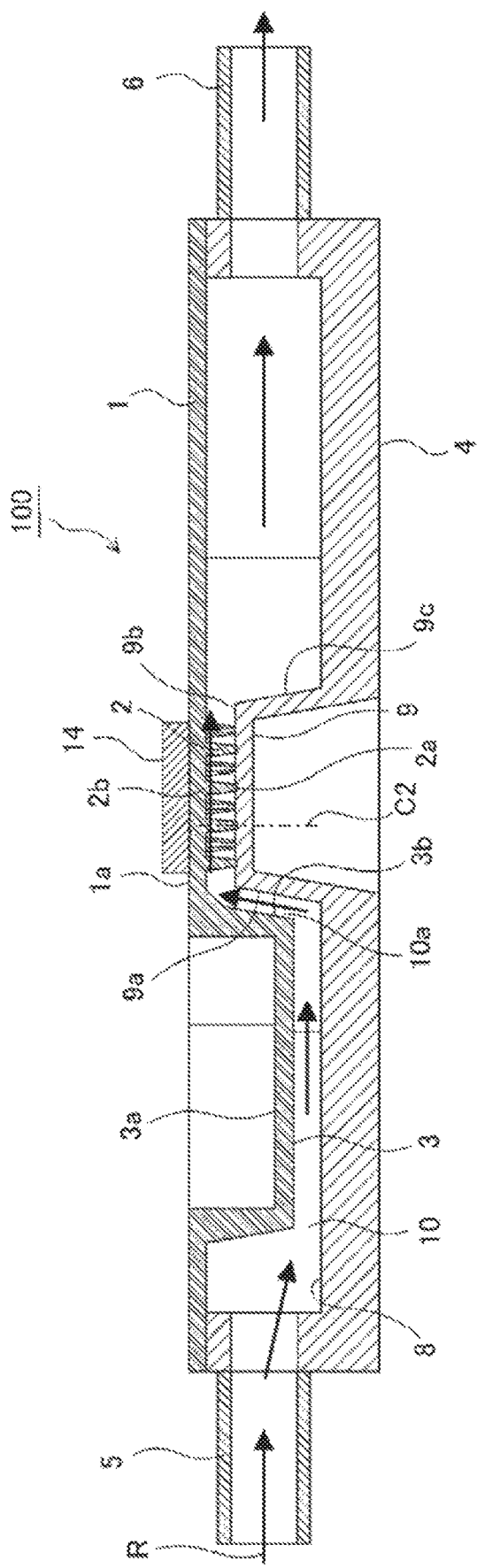
FIG. 2 is a sectional view showing the semiconductor module including the heatsink according to the first embodiment.

Herein, a heatsink according to a first embodiment, and a semiconductor module including the heatsink, will be described based on the drawings. FIG. 1 is an exploded perspective view showing a semiconductor module including a heatsink according to the first embodiment, and FIG. 2 is a sectional view of a portion indicated by A-A in FIG. 1 seen from the direction of the arrows. In the drawings, the same reference sign is allotted to identical or corresponding portions. Also, arrows represented by an arrow R in the drawings indicate a flow of a refrigerant.

A heatsink 100 according to the first embodiment is configured to include a base 1, which has a mounting face 1a on which a semiconductor element 14 such as a power semiconductor element is mounted, and a case 4 that forms a refrigerant channel 10 together with the base 1. The base 1 has a fin region 20 in which a multiple of heat dissipating fins (hereafter, fins 2) are provided in one portion of a heat dissipating face 1b, which is a face on a side opposite to that of the mounting face 1a. The semiconductor element 14, which is a heat generating element, is mounted across a bonding layer to the mounting face 1a of the base 1 corresponding to the fin region 20.

The fins 2 are housed in the case 4, which is disposed opposing the base 1, and disposed in the refrigerant channel 10. The fin 2 is a pin fin having a leading end portion 2a and a base portion 2b. A form and a disposition of fins 2 preferred for a heatsink of the present application will be described in detail in a second embodiment to be described hereafter.

The case 4 is of a box-like form having a multiple of side walls 7 and a bottom wall 8, as shown in FIG. 1. More specifically, the case 4 has eight side walls 7, and a sectional form parallel to a direction in which the refrigerant flows in (the direction indicated by the arrow R in the drawing) is octagonal. Also, the case 4 includes an inlet 5, through which the refrigerant is caused to flow into the refrigerant channel 10, and a discharge port 6, through which the refrigerant is caused to flow out from the refrigerant channel 10. The inlet 5 and the discharge port 6 are disposed in opposing side walls 7a and 7b respectively of the case 4, and both are positioned on a central axis (indicated by a dashed-dotted line C1 in FIG. 1) of the case 4 parallel to the direction in which the refrigerant flows in.

The base 1 has a first protruding portion 3 that protrudes into the refrigerant channel 10 on an upstream side of the fin region 20. The first protruding portion 3 includes a side wall for downstream side 3b that forms the refrigerant channel 10, and the side wall for downstream side 3b neighbors the fin region 20. Also, the first protruding portion 3 is hollow, and the mounting face 1a side of the first protruding portion 3 is a recessed portion. A heat generating element such as a capacitor (omitted from the drawings) is mounted in a bottom portion 3a of the recessed portion.

Also, the case 4 has a hollow second protruding portion 9 that protrudes into the refrigerant channel 10 in a place opposing the fin region 20. The second protruding portion 9 includes a side wall for upstream side 9a that forms the refrigerant channel 10, a fin opposing face 9b, and a side wall for downstream side 9c. The refrigerant channel 10 includes an upwardly inclined channel 10a formed by the side wall for downstream side 3b of the first protruding portion 3 and the side wall for upstream side 9a of the second protruding portion 9. The upwardly inclined channel 10a directs a flow of the refrigerant toward a base portion 2b of the fin 2 and causes the refrigerant to flow into the fin region 20.

A semiconductor module according to the first embodiment is such that a plurality of semiconductor elements 14 are mounted across a bonding layer on the mounting face 1a of the heatsink 100. Specifically, a plurality of power semiconductor elements are mounted on the mounting face 1a of the base 1 corresponding to the fin region 20, and a heat generating element such as a capacitor (omitted from the drawings) is mounted in the bottom portion 3a of the mounting face 1a corresponding to the first protruding portion 3.

Next, the flow of the refrigerant in the heatsink 100 will be described. Refrigerant that flows in through the inlet 5 is diffused along the side wall 7 on both sides of the side wall 7a in which the inlet 5 is provided, and flows in an advancing direction, that is, in the direction of the discharge port 6. Refrigerant that flows into the refrigerant channel 10 passes through the channel portion into which the first protruding portion 3 protrudes. As a sectional channel area of this portion is small, the refrigerant flows quickly, and as the portion is farther upstream than the fin region 20, low-temperature refrigerant is flowing. Because of this, a high cooling effect is obtained by the heat generating element mounted in the bottom portion 3a of the mounting face 1a.

Refrigerant that passes through the channel portion into which the first protruding portion 3 protrudes flows into the upwardly inclined channel 10a. Owing to the refrigerant passing through the upwardly inclined channel 10a, velocity components of the refrigerant include a component that heads toward the base portion 2b of the fin 2. Refrigerant that passes through the upwardly inclined channel 10a flows into the fin region 20 at an angle smaller than 90 degrees with respect to a central axis of the fin 2 (indicated by a dashed-dotted line C2 in FIG. 2). Because of this, the flow velocity of refrigerant that flows into the fin region 20 is greater at the base portion 2b than at the leading end portion 2a. In other words, more refrigerant flows in a vicinity of the base portion 2b of the fin 2 than in a vicinity of the leading end portion 2a of the fin 2.

In the fin region 20, a heat exchange is carried out between the refrigerant and the fins 2. Heat emitted from the heat generating element mounted on the mounting face 1a is dissipated into the refrigerant via the fins 2. At this time, a large amount of the heat exchange is carried out in the vicinity of the base portion 2b of the fin 2, and the leading end portion 2a of the fin 2 barely contributes to heat dissipation. This means that when more refrigerant is caused to flow to the base portion 2b than to the leading end portion 2a of the fin 2, a higher heat dissipating performance is obtained than when the refrigerant is caused to flow uniformly from the leading end portion 2a to the base portion 2b (that is, when the refrigerant is caused to flow at an angle of 90 degrees with respect to the central axis C2 of the fin 2). Refrigerant that passes through the fin region 20, and whose temperature rises owing to the heat exchange, is discharged from the discharge port 6.

According to the first embodiment, as heretofore described, the upwardly inclined channel 10a that directs the flow of refrigerant to the base portion 2b of the fin 2 is provided in the refrigerant channel 10, and more refrigerant is caused to flow to the base portion 2b than to the leading end portion 2a of the fin 2, because of which the heat dissipating performance of the fin 2 improves, and the heatsink 100, which has a high dissipating performance, is obtained. Also, a heat generating element is mounted in the bottom portion 3a on the mounting face 1a side of the first protruding portion 3, because of which a high cooling effect is obtained, and space can be effectively utilized.

Furthermore, by using the box-like form case 4 with the octagonal sectional form, the refrigerant is diffused along the side walls 7 on both sides of the side wall 7a in which the inlet 5 is provided, forming a uniform flow in the width direction of the refrigerant channel 10, because of which variation in the amount of flow in the width direction of the refrigerant channel 10 can be restricted. For these reasons, a semiconductor module including the heatsink 100 according to the first embodiment is such that a high cooling effect is obtained, heat dissipating performance and reliability improve, and a reduction in size is achieved.

Second Embodiment

Figure 3A:
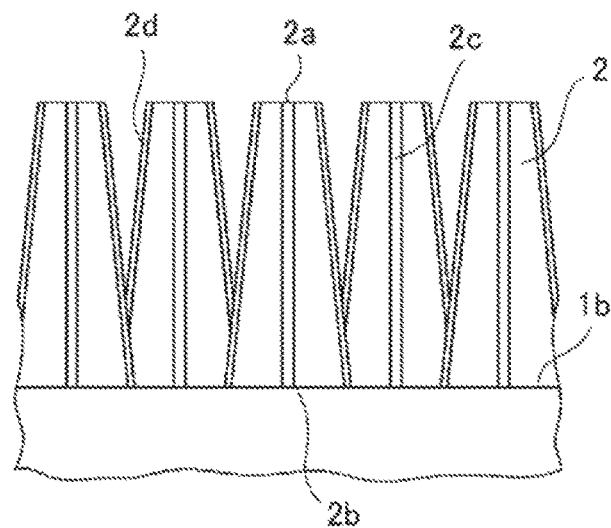
FIGS. 3A and 3B are a front view and a plan view showing heat dissipating fins according to a second embodiment.
Figure 3B:
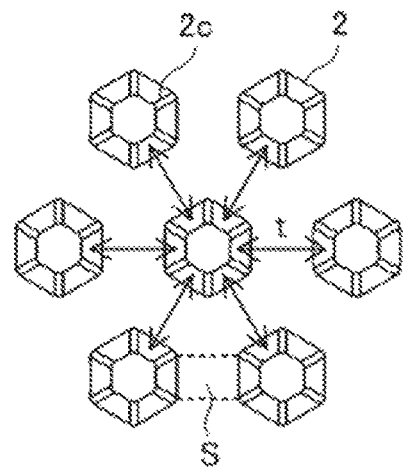
Figure 4A:
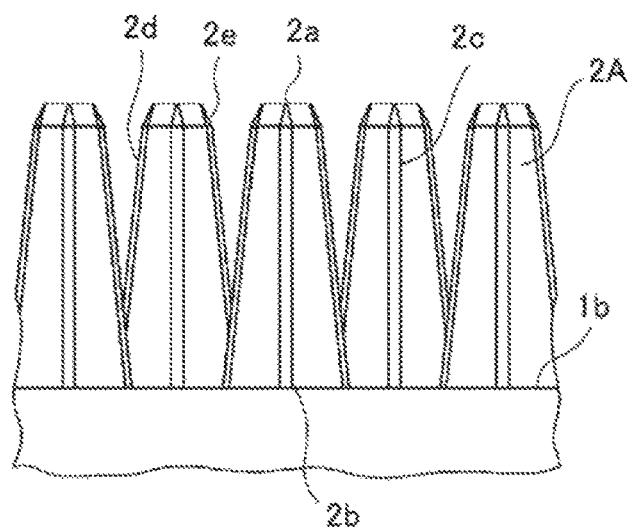
FIGS. 4A and 4B are a front view and a plan view showing other heat dissipating fins according to the second embodiment.
Figure 4B:
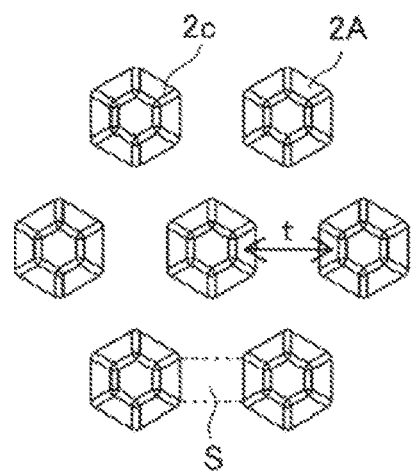
Figure 5:
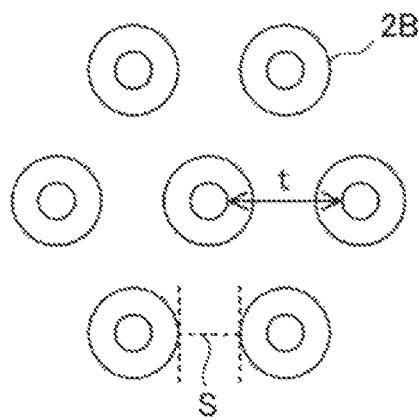
FIG. 5 is a plan view showing heat dissipating fins according to a comparative example.

In the second embodiment, a form and a disposition of heat dissipating fins preferred for a heatsink of the present application will be described. FIGS. 3A and 3B are a front view and a plan view showing heat dissipating fins according to the second embodiment, FIGS. 4A and 4B are a front view and a plan view showing other heat dissipating fins according to the second embodiment, and FIG. 5 is a plan view showing heat dissipating fins according to a comparative example. In the drawings, S indicates a region of maximum flow velocity, and t indicates a distance between fin side faces.

The fin 2 shown in FIG. 3A is a columnar body whose sectional form perpendicular to the central axis is a regular hexagon. The fin 2 has rounded portions 2c wherein corner portions of six side faces are chamfered, and furthermore, has tapers 2d on the side faces. Also, another fin 2A shown in FIG. 4A has second tapers 2e on the leading end portion 2a, in addition to the tapers 2d of the side faces. Because of this, the leading end portion 2a of the fin 2A is finer than that of the fin 2.

By the rounded portions 2c being provided in the corner portions of the fins 2 and 2A, the flow of refrigerant can be smoothened, and pressure loss can be reduced. Also, by the tapers 2d being provided on the side faces, the flow velocity of the refrigerant between fin side faces in a vicinity of the leading end portion 2a decreases, and pressure loss can be reduced. By the second tapers 2e being provided in the leading end portion 2a of the fin 2A, pressure loss decreases further.

Generally, although pressure loss is reduced by a decrease in the refrigerant flow velocity, heat dissipating performance also decreases. In response to this, a heatsink of the present application is such that an improvement in heat dissipating performance is achieved by causing a large amount of the refrigerant to flow to the base portion 2b of the fins 2 and 2A, wherein the distance t between the fin side faces is small. Also, by the tapers 2d or the second tapers 2e being provided on the side faces of the fins 2 and 2A, material can be reduced, and a reduction in part weight is achieved.

The fins 2 and 2A are arranged regularly, as shown in FIGS. 3B and 4B. That is, six fins 2 (2A) are disposed neighboring one fin 2 (2A), and a distance between fins, that is, the distance t between the fin side faces, is constant.

By using the fin 2 (2A) whose sectional form is a regular hexagon in this way, the maximum flow velocity region S between side faces of neighboring fins 2 (2A) becomes larger, and a region in which heat dissipating performance is high becomes larger. Also, by adopting the kind of disposition shown in FIGS. 3B and 4B, a large number of fins 2 (2A) can be disposed even when there is a restriction on the fin region 20, and a heat dissipating area per unit volume of the fin region 20 can be increased.

Meanwhile, when the cylindrical fins 2B are arranged in the same way, as in the comparative example shown in FIG. 5, only a space between side faces that intersect with a straight line joining the central axes of neighboring fins 2B forms the maximum flow velocity region S. Because of this, the heat dissipating performance of only one small portion of the fin 2B is high, and the heat dissipating performance overall is low.

By using the fins 2 or 2A according to the second embodiment in a heatsink of the present application, the heat dissipating performance improves further, and pressure loss can be reduced. Note that a form and a disposition of fins used in a heatsink of the present application are not limited to this.

Third Embodiment

Figure 6:
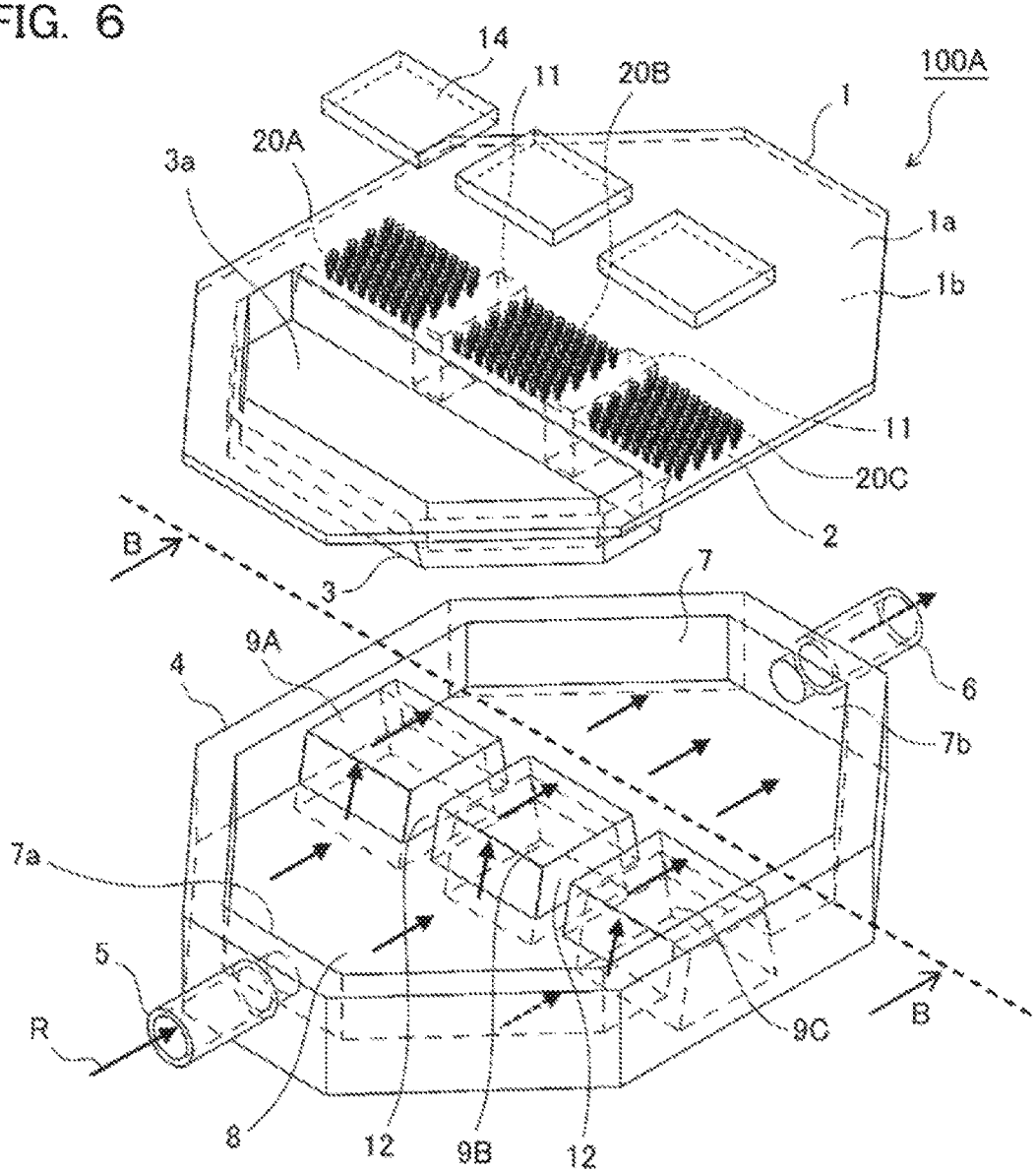
FIG. 6 is an exploded perspective view showing a semiconductor module including a heatsink according to a third embodiment.
Figure 7:
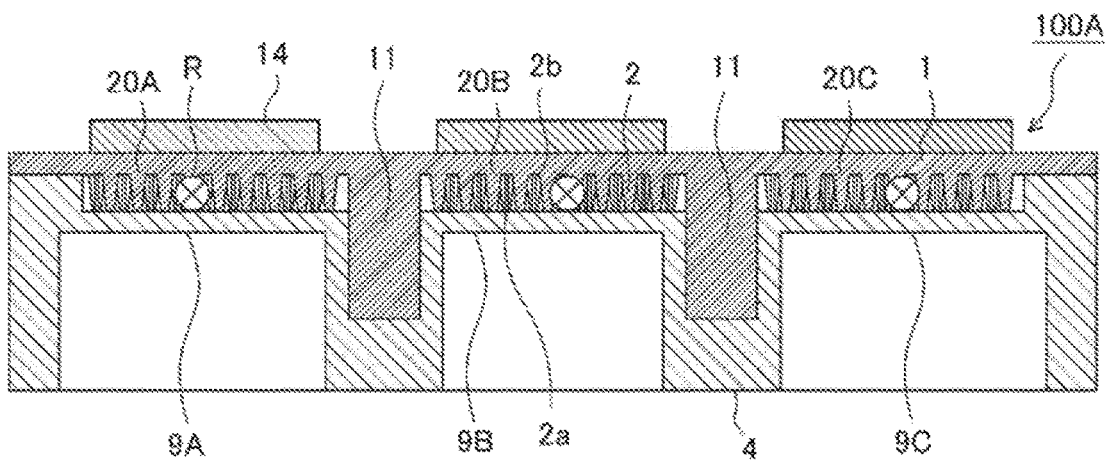
FIG. 7 is a sectional view showing the semiconductor module including the heatsink according to the third embodiment.

FIG. 6 is an exploded perspective view showing a semiconductor module including a heatsink according to a third embodiment, and FIG. 7 is a sectional view of a portion indicated by B-B in FIG. 6 seen from the direction of the arrows. As an overall configuration of a heatsink 100A according to the third embodiment is the same as that of the heatsink 100 according to the first embodiment, a description of each element will be omitted here, and only differing points will be described.

The base 1 configuring the heatsink 100A has a multiple (three in FIG. 6) of fin regions 20A, 20B, and 20C corresponding to places on the mounting face 1a in which a heat generating element is mounted. The multiple of fin regions 20A, 20B, and 20C are arranged in a direction perpendicular to a direction in which a refrigerant flows in (a direction indicated by an arrow R in FIG. 6), and structural bodies 11 that block a flow of the refrigerant are provided among the fin regions 20A, 20B, and 20C. No heat generating element is mounted on the mounting face 1a of the base 1 in positions opposite to the structural bodies 11.

Also, the case 4 has a multiple (three in FIG. 6) of second protruding portions 9A, 9B, and 9C corresponding to the multiple of fin regions 20A, 20B, and 20C. Gaps 12 are provided among the second protruding portions 9A, 9B, and 9C, and the structural bodies 11 are disposed in the gaps 12. Because of this, as shown in FIG. 7, the refrigerant flow among the multiple of fin regions 20A, 20B, and 20C is blocked by the structural bodies 11, and the refrigerant flows concentrated only on the fin regions 20A, 20B, and 20C, because of which the refrigerant flow velocity increases.

The third embodiment is such that, in addition to the same advantages as in the first embodiment, the structural bodies 11 are disposed among the multiple of fin regions 20A, 20B, and 20C, whereby the velocity of the refrigerant flowing through the fin regions 20A, 20B, and 20C can be increased, the heat dissipating performance of the fin 2 increases, and a heat generating element can be effectively cooled.

Fourth Embodiment

Figure 8:
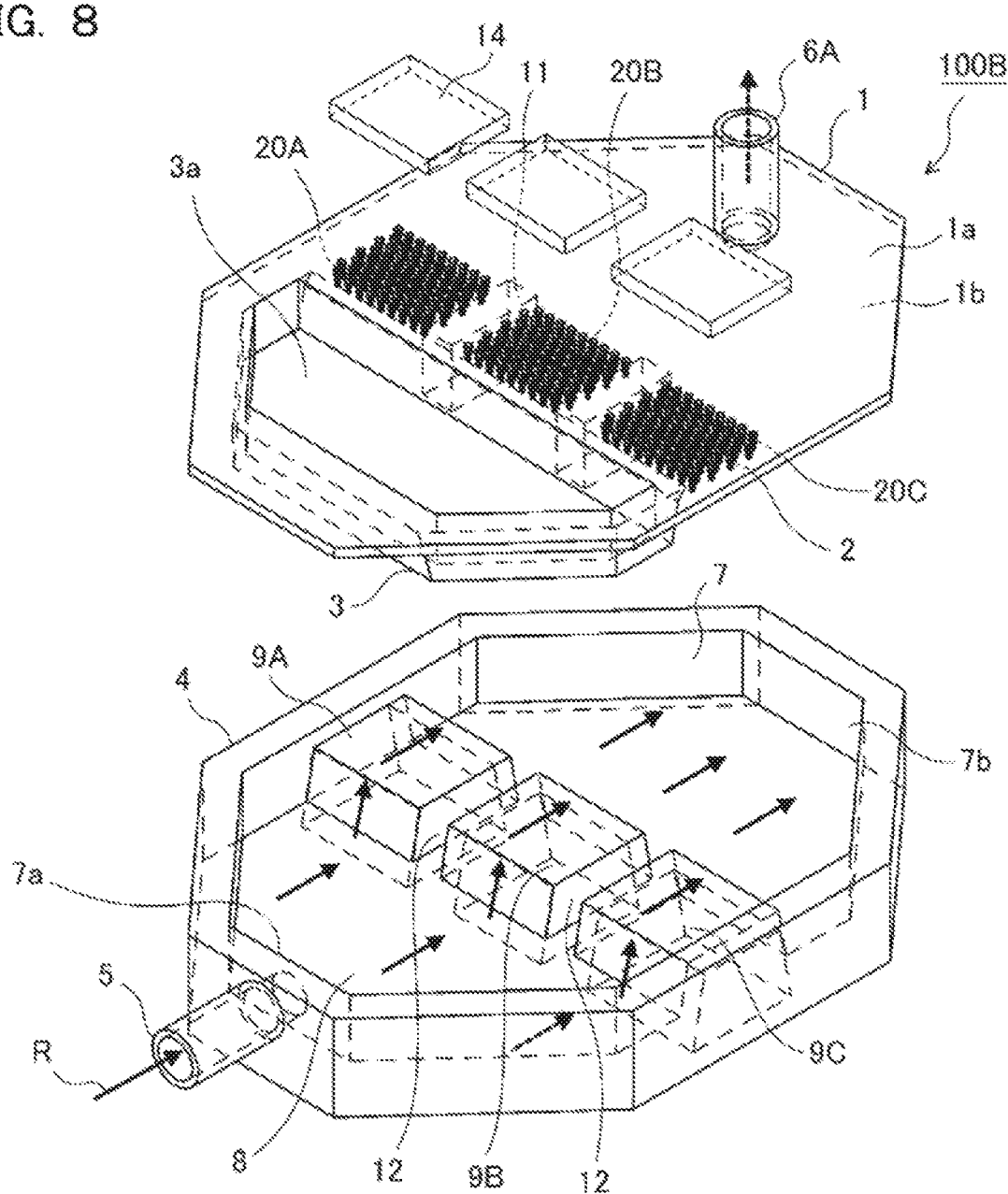
FIG. 8 is an exploded perspective view showing a semiconductor module including a heatsink according to a fourth embodiment.

FIG. 8 is an exploded perspective view showing a semiconductor module including a heatsink according to a fourth embodiment. As an overall configuration of a heatsink 100B according to the fourth embodiment is the same as that of the heatsink 100A according to the third embodiment, a description of each element will be omitted here, and only differing points will be described.

In the heatsink 100A according to the third embodiment, the inlet 5 and the discharge port 6 of the refrigerant are disposed in the opposing side walls 7a and 7b respectively of the case 4. With this kind of disposition, air may remain above an interior of the heatsink 100A, and heat dissipating performance in this portion decreases. In response to this, the heatsink 100B according to the fourth embodiment is such that a discharge port 6A is disposed in the base 1, and the refrigerant is discharged oriented in a direction opposite to a direction of gravity. Because of this, air is unlikely to remain in an interior of the heatsink 100B. The inlet 5 is disposed in the side wall 7a of the case 4, in the same way as in the third embodiment.

The fourth embodiment is such that, in addition to the same advantages as in the third embodiment, the discharge port 6A is disposed in the base 1, and the refrigerant is discharged oriented in a direction opposite to the direction of gravity, because of which air can be prevented from remaining in the interior of the heatsink 100B, and a decrease in heat dissipating performance can be restricted.

Fifth Embodiment

Figure 9:
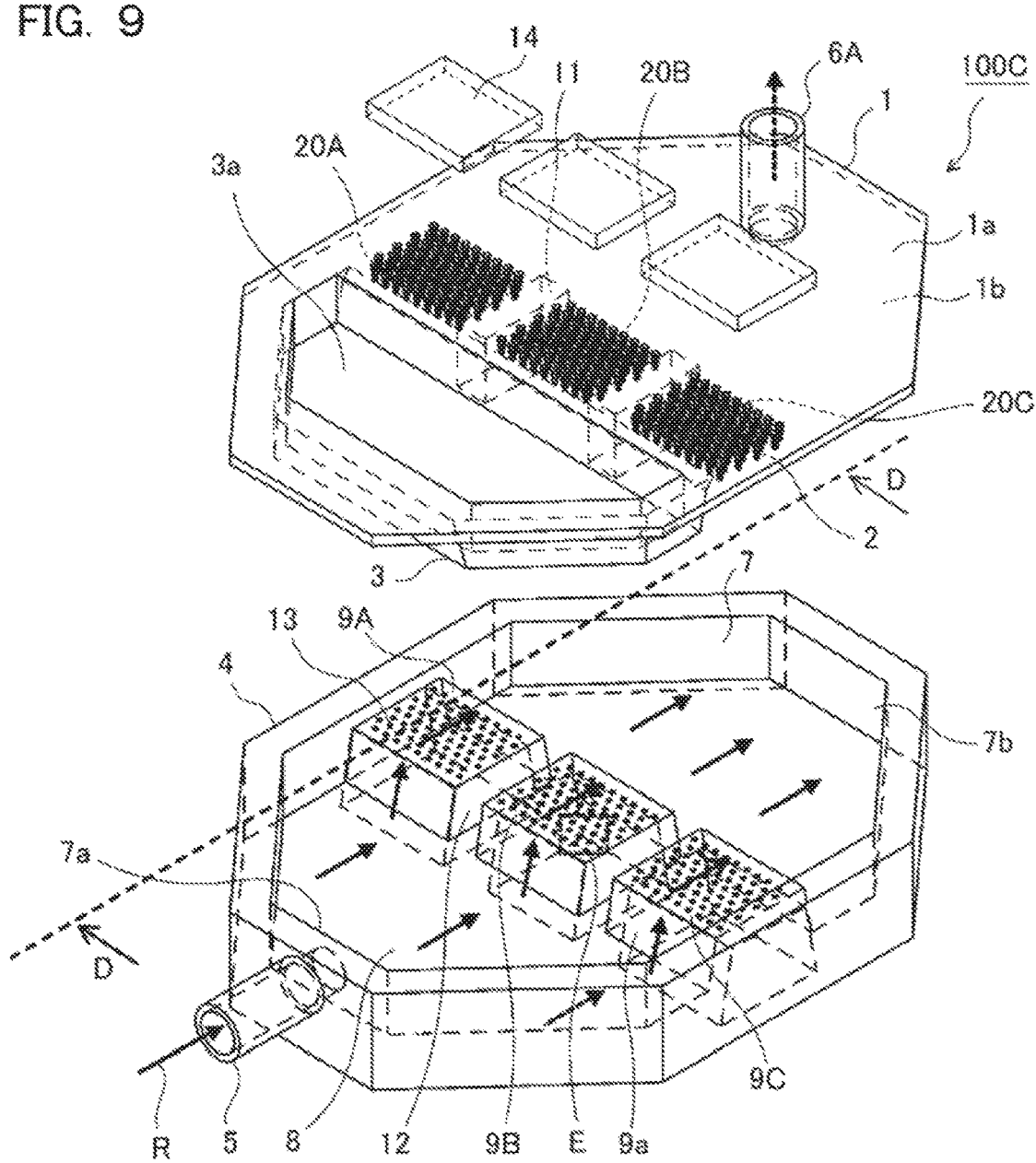
FIG. 9 is an exploded perspective view showing a semiconductor module including a heatsink according to a fifth embodiment.
Figure 10:
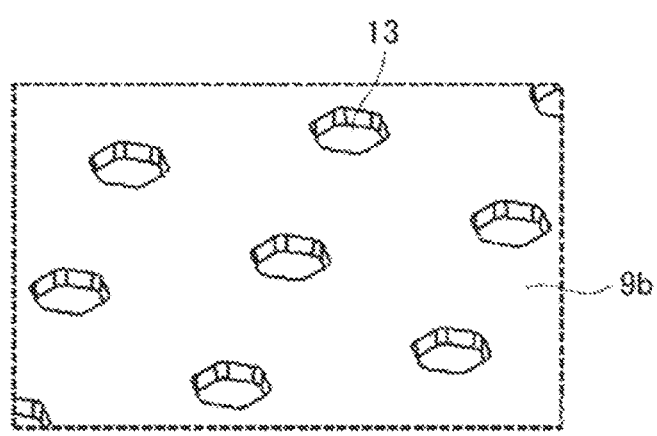
FIG. 10 is an enlarged view showing a portion of a case of the heatsink according to the fifth embodiment.
Figure 11:
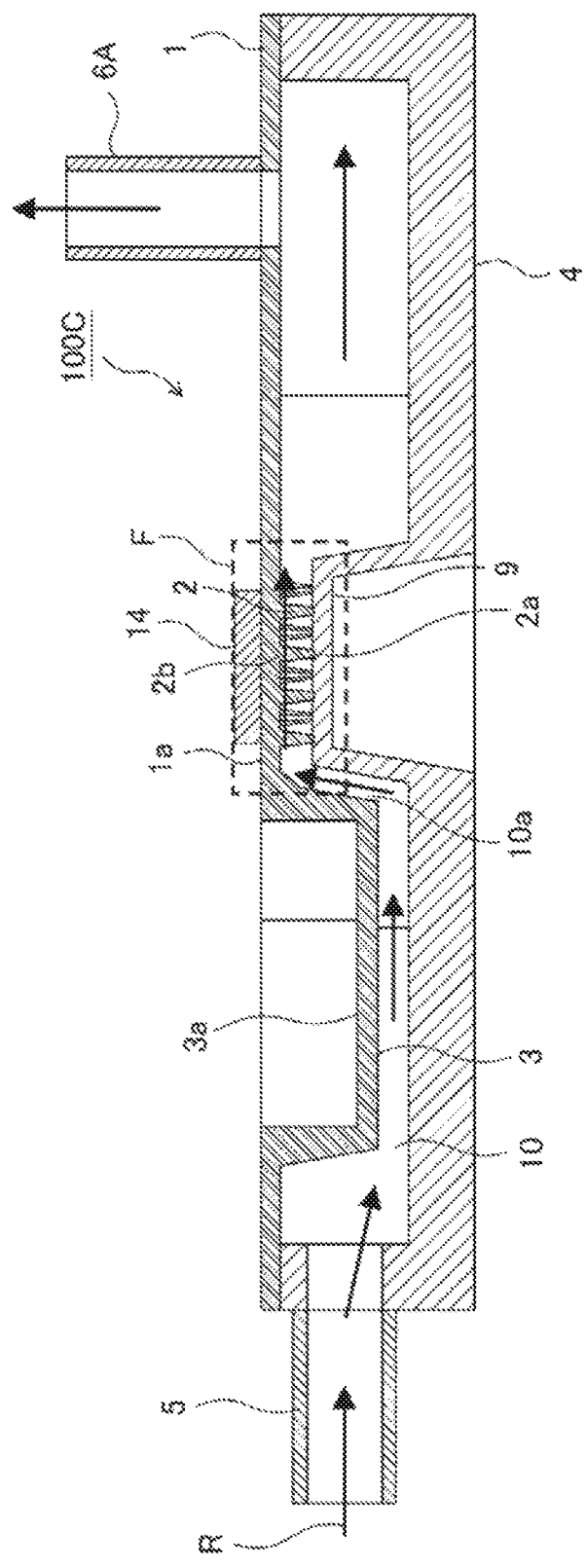
FIG. 11 is a sectional view showing the semiconductor module including the heatsink according to the fifth embodiment.
Figure 12:
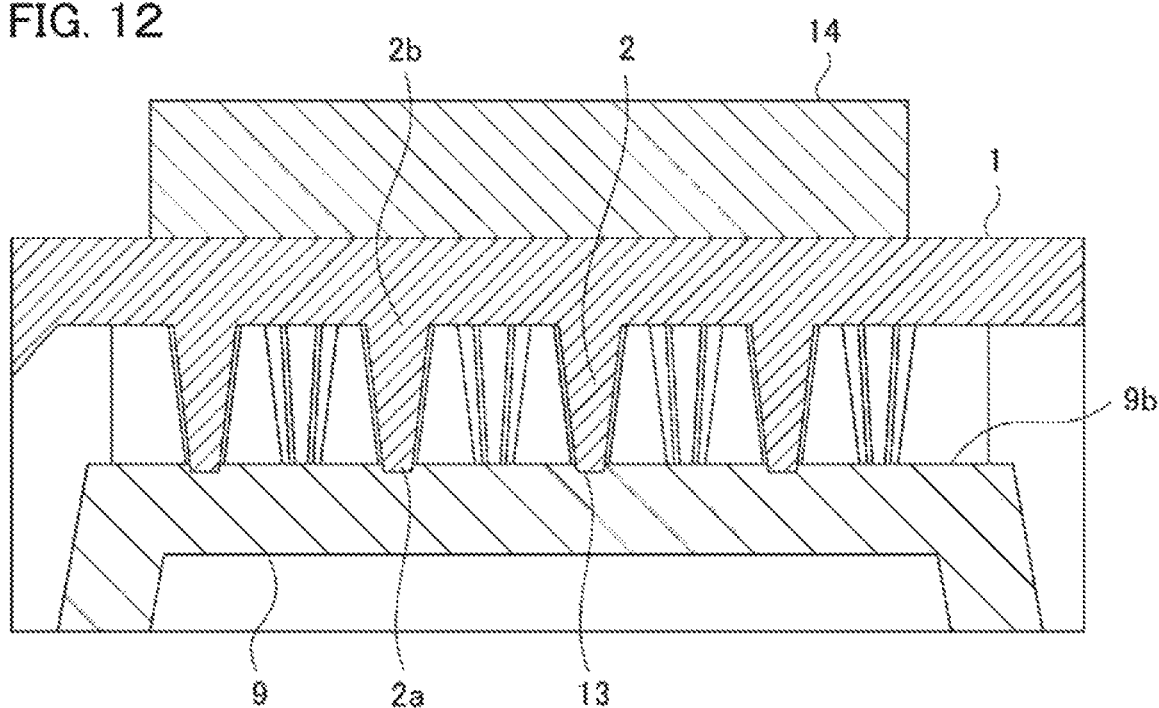
FIG. 12 is an enlarged sectional view showing a portion of the heatsink according to the fifth embodiment.

FIG. 9 is an exploded perspective view showing a semiconductor module including a heatsink according to a fifth embodiment, FIG. 10 is an enlarged view of a portion indicated by E in FIG. 9, FIG. 11 is a sectional view of a portion indicated by D-D in FIG. 9 seen from the direction of the arrows, and FIG. 12 is an enlarged view of a portion indicated by F in FIG. 11. As an overall configuration of a heatsink 100C according to the fifth embodiment is the same as that of the heatsink 100B according to the fourth embodiment, a description of each element will be omitted here, and only differing points will be described.

The case 4 configuring the heatsink 100C has a multiple of holes 13 in the fin opposing faces 9b of the second protruding portions 9A, 9B, and 9C that oppose the fin region 20. As shown in FIG. 10, a form of the hole 13 is a regular hexagon, the same as that of the leading end portion 2a of the fin 2. A size of the hole 13 in a planar direction may be formed to be larger than a projected area of the leading end portion 2a of the fin 2, thereby absorbing an assembly error. As shown in FIG. 12, the leading end portion 2a of the fin 2 is fixed in a state inserted into the hole 13.

Generally, when a gap exists between the leading end portion 2a of the fin 2 and the fin opposing face 9b, the refrigerant flow velocity decreases, and the heat dissipating performance worsens. In response to this, the heatsink 100C according to the fifth embodiment is such that the leading end portion 2a of the fin 2 is inserted into the hole 13 provided in the fin opposing face 9b, because of which no gap exists between the leading end portion 2a of the fin 2 and the fin opposing face 9b. Because of this, a decrease in flow velocity of refrigerant that passes through the fin region 20 can be restricted.

The fifth embodiment is such that, in addition to the same advantages as in the fourth embodiment, the leading end portion 2a of the fin 2 is inserted into and fixed in the hole 13, whereby a decrease in flow velocity of refrigerant in the fin region 20 can be prevented, and a decrease in heat dissipating performance can be restricted.

Although the present application is described above in terms of various exemplifying embodiments and implementations, it should be understood that the various features, aspects, and functionality described in one or more of the individual embodiments are not limited in their application to the particular embodiment with which they are described, but instead can be applied, alone or in various combinations, to one or more of the embodiments of the present application.

It is therefore understood that numerous modifications that have not been exemplified can be devised without departing from the scope of the present application. For example, at least one constituent component may be modified, added, or eliminated. At least one of the constituent components mentioned in at least one of the preferred embodiments may be selected and combined with the constituent components mentioned in another preferred embodiment.

What is claimed is:

1. A heatsink, comprising:
 a base having a mounting face on which a semiconductor element is mounted, and having a fin region in which a multiple of fins are provided in one portion of a face on a side opposite to that of the mounting face;
 a case that is disposed opposing the base, houses the fins, and forms a refrigerant channel together with the base;
 an inlet that causes a refrigerant to flow into the refrigerant channel; and
 a discharge port that causes the refrigerant to flow out from the refrigerant channel, wherein
 the base has a first protruding portion that protrudes into the refrigerant channel on an upstream side of the fin region and the case has a second protruding portion that protrudes into the refrigerant channel in a place opposing the fin region,
 the refrigerant channel includes an upwardly inclined channel formed by a side wall for downstream side of the first protruding portion and a side wall for upstream side of the second protruding portion, and the upwardly inclined channel directs a flow of the refrigerant toward a base portion of the fin and causes the refrigerant to flow into the fin region.

2. The heatsink according to claim 1, wherein the fin is a columnar body whose sectional form perpendicular to a central axis is a regular hexagon, has rounded portions in corner portions of six side faces, and has tapers on the side faces.

3. The heatsink according to claim 2, wherein the fin has a second taper in a leading end portion.

4. The heatsink according to claim 2, wherein six of the fins are disposed neighboring one of the fins, and a distance between fins is constant.

5. The heatsink according to claim 2, wherein the first protruding portion is hollow, the mounting face side of the first protruding portion is a recessed portion, and the semiconductor element is mounted in a bottom portion of the recessed portion.

6. The heatsink according to claim 2, wherein the base has a plurality of the fin region arranged in a direction perpendicular to the direction in which the refrigerant flows in, structural bodies that block the flow of the refrigerant are provided among the fin regions, the case has a multiple of the second protruding portion corresponding to the multiple of the fin region, and the structural bodies are disposed in gaps provided among the second protruding portions.

7. The heatsink according to claim 2, wherein the case has a multiple of holes in a face of the second protruding portion opposing the fin region, and the leading end portions of the fins are fixed in a state inserted into the holes.

8. The heatsink according to claim 1, wherein the first protruding portion is hollow, the mounting face side of the first protruding portion is a recessed portion, and the semiconductor element is mounted in a bottom portion of the recessed portion.

9. The heatsink according to claim 8, wherein the base has a plurality of the fin region arranged in a direction perpendicular to the direction in which the refrigerant flows in, structural bodies that block the flow of the refrigerant are provided among the fin regions, the case has a multiple of the second protruding portion corresponding to the multiple of the fin region, and the structural bodies are disposed in gaps provided among the second protruding portions.

10. The heatsink according to claim 8, wherein the case has a multiple of holes in a face of the second protruding portion opposing the fin region, and the leading end portions of the fins are fixed in a state inserted into the holes.

11. The heatsink according to claim 1, wherein the case is of a box-like form having a bottom wall and a multiple of side walls.

12. The heatsink according to claim 11, wherein the case has eight side walls, and a sectional form parallel to a direction in which the refrigerant flows in is octagonal.

13. The heatsink according to claim 11, wherein the inlet is disposed in the side wall of the case, and is positioned on a central axis of the case parallel to the direction in which the refrigerant flows in.

14. The heatsink according to claim 13, wherein the discharge port is disposed in the side wall of the case, and is positioned on the central axis of the case parallel to the direction in which the refrigerant flows in.

15. The heatsink according to claim 13, wherein the discharge port is disposed in the base, and the refrigerant is discharged oriented in a direction opposite to a direction of gravity.

16. The heatsink according to claim 1, wherein the base has a plurality of the fin region arranged in a direction perpendicular to the direction in which the refrigerant flows in, structural bodies that block the flow of the refrigerant are provided among the fin regions, the case has a multiple of the second protruding portion corresponding to the multiple of the fin region, and the structural bodies are disposed in gaps provided among the second protruding portions.

17. The heatsink according to claim 16, wherein the case has a multiple of holes in a face of the second protruding portion opposing the fin region, and the leading end portions of the fins are fixed in a state inserted into the holes.

18. The heatsink according to claim 1, wherein the case has a multiple of holes in a face of the second protruding portion opposing the fin region, and the leading end portions of the fins are fixed in a state inserted into the holes.

19. A semiconductor module including the heatsink according to claim 1, wherein the semiconductor element is mounted on the mounting face.

* * * * *